(12) United States Patent
Ge et al.

(10) Patent No.: US 9,870,822 B2
(45) Date of Patent: Jan. 16, 2018

(54) NON-VOLATILE MEMORY ELEMENT WITH THERMAL-ASSISTED SWITCHING CONTROL

(71) Applicant: HEWLETT-PACKARD DEVELOPMENT COMPANY, L.P., Houston, TX (US)

(72) Inventors: Ning Ge, Palo Alto, CA (US); Jianhua Yang, Palo Alto, CA (US); Zhiyong Li, Foster City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/102,718

(22) PCT Filed: Dec. 18, 2013

(86) PCT No.: PCT/US2013/076221
§ 371 (c)(1),
(2) Date: Jun. 8, 2016

(87) PCT Pub. No.: WO2015/094242
PCT Pub. Date: Jun. 25, 2015

(65) Prior Publication Data
US 2017/0032837 A1    Feb. 2, 2017

(51) Int. Cl.
*G11C 13/00* (2006.01)
*H01L 45/00* (2006.01)
*H01L 27/24* (2006.01)
*G11C 11/56* (2006.01)

(52) U.S. Cl.
CPC ...... *G11C 13/0069* (2013.01); *G11C 11/5685* (2013.01); *G11C 13/0007* (2013.01); *H01L 27/2463* (2013.01); *H01L 45/08* (2013.01); *H01L 45/1233* (2013.01); *H01L 45/1286* (2013.01); *H01L 45/145* (2013.01); *H01L 45/146* (2013.01); *H01L 45/16* (2013.01); 
(Continued)

(58) Field of Classification Search
CPC ............ G11C 13/0069; G11C 13/0004; G11C 13/0007
USPC ............................. 365/148, 200, 201, 189.07
See application file for complete search history.

(56) References Cited

U.S. PATENT DOCUMENTS

| 7,804,704 B2 | 9/2010 | Veronique Sousa |
| 8,227,896 B2 | 7/2012 | Jiang et al. |

(Continued)

FOREIGN PATENT DOCUMENTS

| KR | 10-20110050011 A | 5/2011 |
| WO | WO-2009130668 | 10/2009 |

OTHER PUBLICATIONS

Jung, S-W. et al., Nonvolatile Ferroelectric P (VDF-TrFE) Memory Transistors Based on Inkjet-printed Organic Semiconductor, Aug. 2013, vol. 35, No. 4.

(Continued)

*Primary Examiner* — Jason Lappas
(74) *Attorney, Agent, or Firm* — HP Inc. Patent Department

(57) ABSTRACT

A non-volatile memory element with thermal-assisted switching control is disclosed. The non-volatile memory element is disposed on a thermal inkjet resistor. Methods for manufacturing the combination and methods of using the combination are also disclosed.

19 Claims, 7 Drawing Sheets

(52) U.S. Cl.
CPC .... *G11C 13/0004* (2013.01); *G11C 2013/008* (2013.01); *G11C 2213/32* (2013.01)

(56) References Cited

U.S. PATENT DOCUMENTS

| | | | |
|---|---|---|---|
| 8,605,484 B2* | 12/2013 | Borghetti | G11C 13/0007 365/148 |
| 2006/0250856 A1* | 11/2006 | Bertin | B82Y 10/00 365/182 |
| 2009/0184397 A1* | 7/2009 | Gergel-Hackett | H01L 45/1608 257/536 |
| 2011/0096589 A1* | 4/2011 | Bratkovski | G11C 13/0007 365/148 |
| 2011/0182108 A1 | 7/2011 | Williams et al. | |
| 2011/0261608 A1 | 10/2011 | Borghetti et al. | |
| 2012/0124442 A1* | 5/2012 | Strauss | G06F 11/0727 714/746 |
| 2012/0155159 A1 | 6/2012 | Prejbeanu | |
| 2013/0003438 A1 | 1/2013 | Merkel et al. | |
| 2013/0106930 A1 | 5/2013 | Lea et al. | |
| 2013/0250708 A1 | 9/2013 | Seroussi et al. | |
| 2015/0033064 A1* | 1/2015 | Davis | G11C 29/4401 714/6.11 |

OTHER PUBLICATIONS

Ueda, M. et al., Biologically-inspired Learning Device Using Three-terminal Ferroelectric Memristor, Jun. 18-20, 2012.

Zhu, X. et al., Multi-level Programming of Memristor in Nanocrossbar, Feb. 26, 2013, pp. 1-7, vol. 10, No. 5.

\* cited by examiner

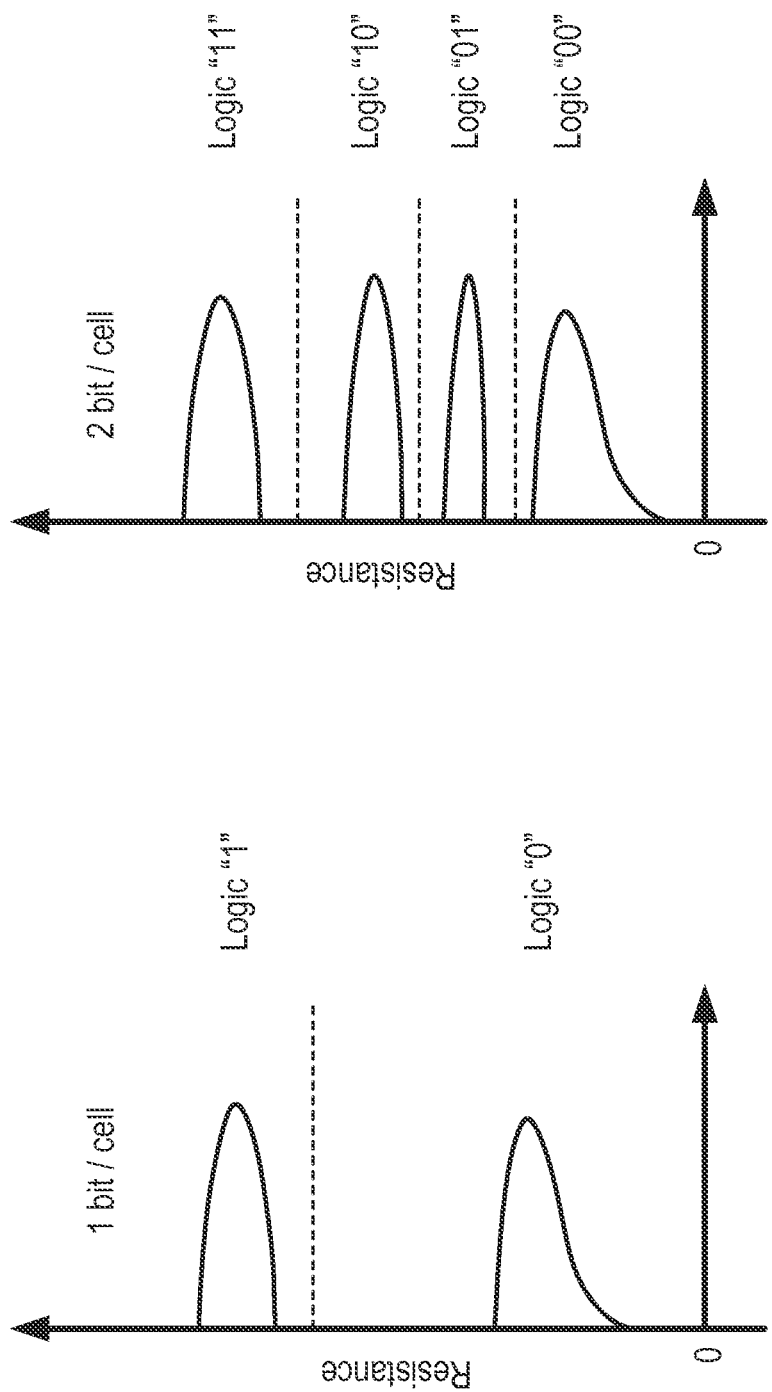

NON-VOLATILE MEMORY ELEMENT WITH THERMAL-ASSISTED SWITCHING CONTROL

BACKGROUND

Non-volatile memory is computer memory that can get back stored information even when not powered. Types of non-volatile memory may include resistive RAM (random access memory) (RRAM or ReRAM), phase change RAM (PCRAM), conductive bridge RAM (CBRAM), ferroelectric RAM (F-RAM), etc.

Resistance memory elements can be programmed to different resistance states by applying programming energy. After programming, the state of the resistive memory elements can be read and remains stable over a specified time period. Large arrays of resistive memory elements can be used to create a variety of resistive memory devices, including non-volatile solid state memory, programmable logic, signal processing, control systems, pattern recognition devices, and other applications. Examples of resistive memory devices include valence change memory and electrochemical metallization memory, both of which involve ionic motion during electrical switching and belong to the category of memristors.

Memristors are devices that can be programmed to different resistive states by applying a programming energy, for example, a voltage or current pulse. This energy generates a combination of electric field and thermal effects that can modulate the conductivity of both non-volatile switch and non-linear select functions in a memristive element. After programming, the state of the memristor can be read and remains stable over a specified time period.

BRIEF DESCRIPTION OF THE DRAWINGS

FIGS. 3A and 3B, each having a vertical axis in resistance, depict the resistance levels of a memristor cell having 1 bit/cell (FIG. 3A) and a memristor cell having 2 bits/cell (FIG. 3B), according to an example.

DETAILED DESCRIPTION

Figure 1A:
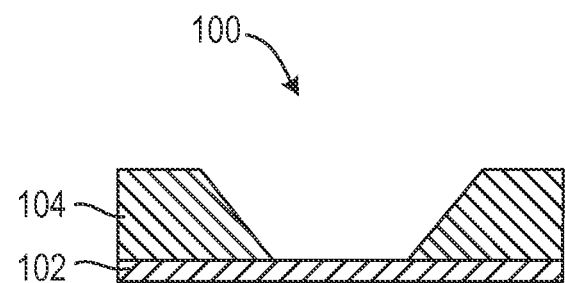
FIGS. 1A and 1B are cross-sectional views of examples of two different thermal inkjet structures employed in the practice of the teachings herein.

In the following description, numerous details are set forth to provide an understanding of the examples disclosed herein. However, it will be understood that the examples may be practiced without these details. While a limited number of examples have been disclosed, it should be understood that there are numerous modifications and variations therefrom. Similar or equal elements in the Figures may be indicated using the same numeral.

As used in the specification and claims herein, the singular forms "a," "an," and "the" include plural referents unless the context clearly dictates otherwise.

As used in this specification and the appended claims, "approximately" and "about" mean a ±10% variance caused by, for example, variations in manufacturing processes.

In the following detailed description, reference is made to the drawings accompanying this disclosure, which illustrate specific examples in which this disclosure may be practiced. The components of the examples can be positioned in a number of different orientations and any directional terminology used in relation to the orientation of the components is used for purposes of illustration and is in no way limiting. Directional terminology includes words such as "top," "bottom," "front," "back," "leading," "trailing," etc.

It is to be understood that other examples in which this disclosure may be practiced exist, and structural or logical changes may be made without departing from the scope of the present disclosure. Therefore, the following detailed description is not to be taken in a limiting sense. Instead, the scope of the present disclosure is defined by the appended claims.

Non-volatile memory elements can be used in a variety of applications, such as read-only memory, reprogrammable memory, and other uses where long term persistent storage is required.

Resistive memory elements can be used in a variety of applications, including non-volatile solid state memory, programmable logic, signal processing, control systems, pattern recognition, and other applications.

As used in the specification and appended claims, the term "resistance memory elements" refers broadly to programmable non-volatile resistors where the switching mechanism involves atomic motion and rearrangement, including valance change memory, electrochemical metallization memory, and others.

Memristors, or memristive devices, are nano-scale devices that may be used as a component in a wide range of electronic circuits, such as memories, switches, and logic circuits and systems. In a memory structure, a crossbar of memristors may be used. For example, when used as a basis for memories, the memristor may be used to store a bit of information, 1 or 0, corresponding to whether the memristor is in its high or low resistance state (or vice versa). When used as a logic circuit, the memristor may be employed as configuration bits and switches in a logic circuit that resembles a Field Programmable Gate Array, or may be the basis for a wired-logic Programmable Logic Array. It is also possible to use memristors capable of multi-state or analog behavior for these and other applications.

When used as a switch, the memristor may either be in a low resistance (closed) or high resistance (open) state in a cross-point memory. During the last few years, researchers have made great progress in finding ways to make the switching function of these memristors behave efficiently. For example, tantalum oxide ($TaO_x$)-based memristors have been demonstrated to have superior endurance over other nano-scale devices capable of electronic switching. In lab settings, tantalum oxide-based memristors are capable of over 10 billion switching cycles.

A memristor may comprise a switching material, such as $TiO_x$ or $TaO_x$, sandwiched between two electrodes. Memristive behavior is achieved by the movement of ionic species (e.g., oxygen ions or vacancies) within the switching material to create localized changes in conductivity via modulation of a conductive filament between two electrodes, which results in a low resistance "ON" state, a high resistance "OFF" state, or intermediate states. Initially, when the memristor is first fabricated, the entire switching material may be nonconductive. As such, a forming process may be required to form the conductive channel in the switching material between the two electrodes. A known forming process, often called "electroforming", includes applying a sufficiently high (threshold) voltage across the electrodes for a sufficient length of time to cause a nucleation and formation of a localized conductive channel (or active region) in the switching material. The threshold voltage and the length of time required for the forming process may depend upon the type of material used for the switching material, the first electrode, and the second electrode, and the device geometry.

Metal or semiconductor oxides may be employed in memristive devices; examples include either transition metal oxides, such as tantalum oxide, titanium oxide, yttrium oxide, hafnium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include transition metal nitrides, such as aluminum nitride, gallium nitride, tantalum nitride, and silicon nitride.

Memristive devices may include a continuous oxide film between the electrodes. Filaments/ionic diffusion are formed in the oxide film between the electrodes in a random fashion, much like lightning, that may take the path of least resistance. This random path causes variations in the memristor I-V characteristics from switching cycle to cycle and especially from device to device. Older memristive or non-volatile resistive memory devices that are either unipolar or bipolar tend to have this random conductive path between the electrodes; that is, the vacancies have to find their own path to the opposite electrodes. This randomness in the conductive channel formation may cause variability in reproducibility and/or reliability issues, which is one of the biggest challenges in the commercialization of these devices.

Figure 1B:
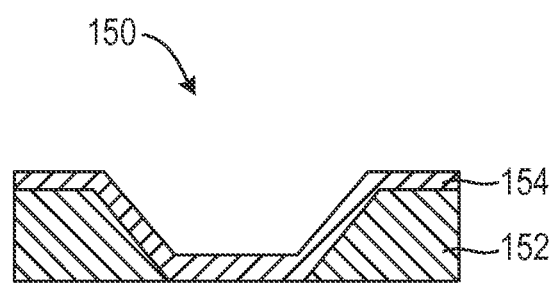

Thermal inkjet (TIJ) technology employs a resistor to boil ink to create a vapor "drive" bubble that ejects a droplet of ink involving rapid nucleation and bubble growth. Compatible to the standard CMOS, the TIJ resistor often may employ a high sheet resistivity and a low sheet resistivity dual metal layer deposition, followed by an etching process. FIGS. 1A-1B depict two examples of TIJ structures.

The TIJ structure 100 shown in FIG. 1A may use a high resistivity alloy, such as TaAl, WSiN, TaAlOx, TiN or other suitable alloy as a lower layer 102, with an upper layer 104 of a low resistivity alloy, such as AlCu on top. In this structure, the bottom layer 102, which has a relatively high sheet resistance of 30 to 120 ohm/sq, may be first deposited. Next, the top layer 104, which has a relatively low sheet resistance of about 0.04 to 0.08 ohm/sq, may be deposited. Following the depositions, a dry etch (to define the resistor width) and a wet or dry etch (Slope Metal Etch (SME)/Dry Resistor Etch (DRE) process to define resistor length) may be applied to define the resistor 100. One of the aspects of the TIJ resistor 100 is that the Temperature Coefficient of Resistance (TCR) is very low and the resistor is very stable with high endurance for hundreds of thousands or millions of ink droplet firings.

The TIJ structure 150 shown in FIG. 1B may use a multilayer lower layer 152 of TiN/AlCu, with a high resistivity layer 154 of TaAl, WSiN, TaAlOx, TiN or other suitable alloy on top. Again, the lower layer 152 has a relatively high sheet resistance (about 0.04 to 0.08 ohm/sq) and the upper layer 154 has a relatively low sheet resistance (about 425 ohms/sq). Again, a dry etch, followed by a wet or dry etch, may be used to define the resistor 150. As with the resistor depicted in FIG. 1A, an aspect of the TIJ resistor 150 is that the TCR is very low and the resistor is very stable with high endurance.

Table I below shows the mainstream of the TIJ resistor architecture currently used in TIJ printheads for the resistors 100 and 150 depicted in FIGS. 1A and 1B, respectively.

TABLE I

Properties of TIJ Resistor Structures

| Property | TaAl | WSiN |
|---|---|---|
| Thickness | ~95 nm | 95 nm |
| Sheet ρ | 30 ohms/sq | 425 ohms/sq |
| Requires anneal | No | Yes |

To fire the ink droplet from the TIJ, an electrical pulse from a printer may be applied to the resistor. That pulse is typically a 5- to 35-volt square pulse. The duration varies from 1 to 3 μs, depending on the product. During that time, the resistor, underlayers, and the passivation layers (on top of TIJ resistor) between the resistor and ink heat rapidly. The temperature where liquid contacts the passivation layer jumps from 25° C. to a minimum of 310° C. Thus, an extremely steep heating rate (about 100 million° C. per second) produces a super heat to generate the bubble to push the ink droplet out.

Figure 2:
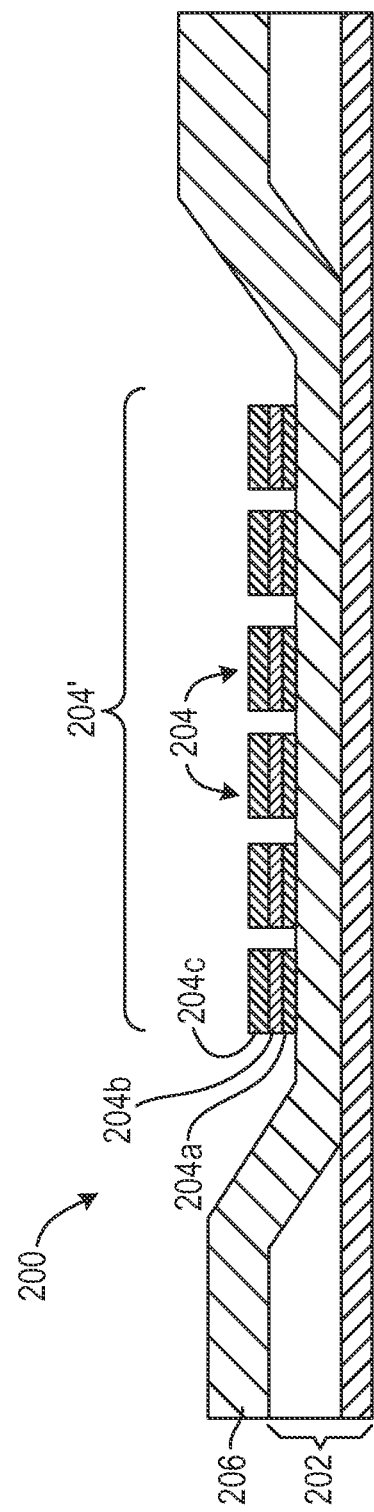
FIG. 2 is a cross-sectional view of a plurality of memristors formed on a thermal element, here, a thermal inkjet structure, according to an example.

In accordance with the teachings herein, a thermal element, such as the TIJ resistor, may be used as a heater under a non-volatile memory element array as shown in FIG. 2. In this manner, the non-volatile memory element may be heated to a certain temperature, which can be tuned through the TIJ resistor resistance, applied voltage, and pulse. The combination of the non-volatile memory element and the TIJ resistor may find application with resistance memory elements, such as memristors, and with phase change memory elements.

The controlled heating of the non-volatile memory element may be used to accomplish several different tasks, each depending on a different temperature regime.

The first task involves using heat to control the resistance level for multi-cell applications. Consider that the temperature regime is identified as $T_1$. Multi-cell applications are described in further detail below.

The second task involves using heat to repair a "dead" non-volatile memory element. In the case of a memristor, for example, a dead memristor is in a low resistance state and thus behaves as a conductor. Heating an array of elements may dissolve the conduction channel and may repair a memristor array with many failed devices. Consider that the temperature regime is identified as $T_2$.

The third task involves using heat to heat an array of non-volatile memory elements, such as memristors, up to an elevated temperature and apply an electrical bias to a memristor in a low resistance state to reset the memristor. Consider that the temperature regime is identified as $T_3$.

The fourth task involves minimizing failures caused by the electroforming (or forming) process. The electroforming process may cause failures due to the relatively high voltages applied. Heating the array and applying a forming voltage could result in a reduction in failures, since a lower voltage may be required for the forming process. Consider that the temperature regime is identified as $T_4$.

$T_2$ may be a relatively high heat, and is the highest of the four regimes. The other temperature regimes are considered with regard to $T_2$.

$T_1$ may be within a range of about ambient temperature to below $T_2$.

$T_3$ may be within a range of above ambient temperature to below $T_2$.

$T_4$ may be within a range of above ambient temperature to below $T_2$.

The foregoing temperature regimes depend on a variety of factors, including the materials of the non-volatile memory element, or memristor. Determination of a particular temperature regime to accomplish a particular task, and for the person skilled in the art, is not considered to be undue experimentation.

The device 200 depicted in FIG. 2 may include the thermal element, e.g., thermal inkjet resistor, 202, such as either of the TIJ resistors depicted in FIGS. 1A and 1B. Other thermal elements may alternatively be employed. The thermal inkjet resistor may be disposed on a substrate (not shown). The device 200 may further include one or more resistive memory elements 204, such as a memristor. The memristor 204, or, as shown in FIG. 2, an array 204' of memristors 204, may be separated from the TIJ resistor 202 by a passivation layer 206. Examples of materials suitably used as a passivation layer include, but are not limited to, silicon nitride, silicon carbide, silicon dioxide, and the like.

The memristor 204 may have a structure that includes a bottom electrode 204a, a top electrode 204b, and an active region 204c sandwiched therebetween. Examples of materials for electrodes 204a, 204b include, but are not limited to, aluminum (Al), copper (Cu), platinum (Pt), tungsten (W), gold (Au), titanium (Ti), silver (Ag), ruthenium dioxide ($RuO_2$), titanium nitride (TiN), tungsten nitride ($WN_2$), tantalum (Ta), tantalum nitride (TaN) or the like. The electrode materials may be the same or different for the two electrodes 204a, 204b. The electrodes 204a 204b may be patterned, if desired. The thickness of the electrodes 204a, 204b may be in the range of about 10 nm to a few micrometers.

The bottom electrode 204a may be formed on the passivating layer 206 by any of a number of processes, including electroplating, sputtering, evaporation, ALD (atomic layer deposition), co-deposition, chemical vapor deposition, IBAD (ion beam assisted deposition), oxidation of pre-deposited materials, or any other film deposition technology.

Figure 2A:
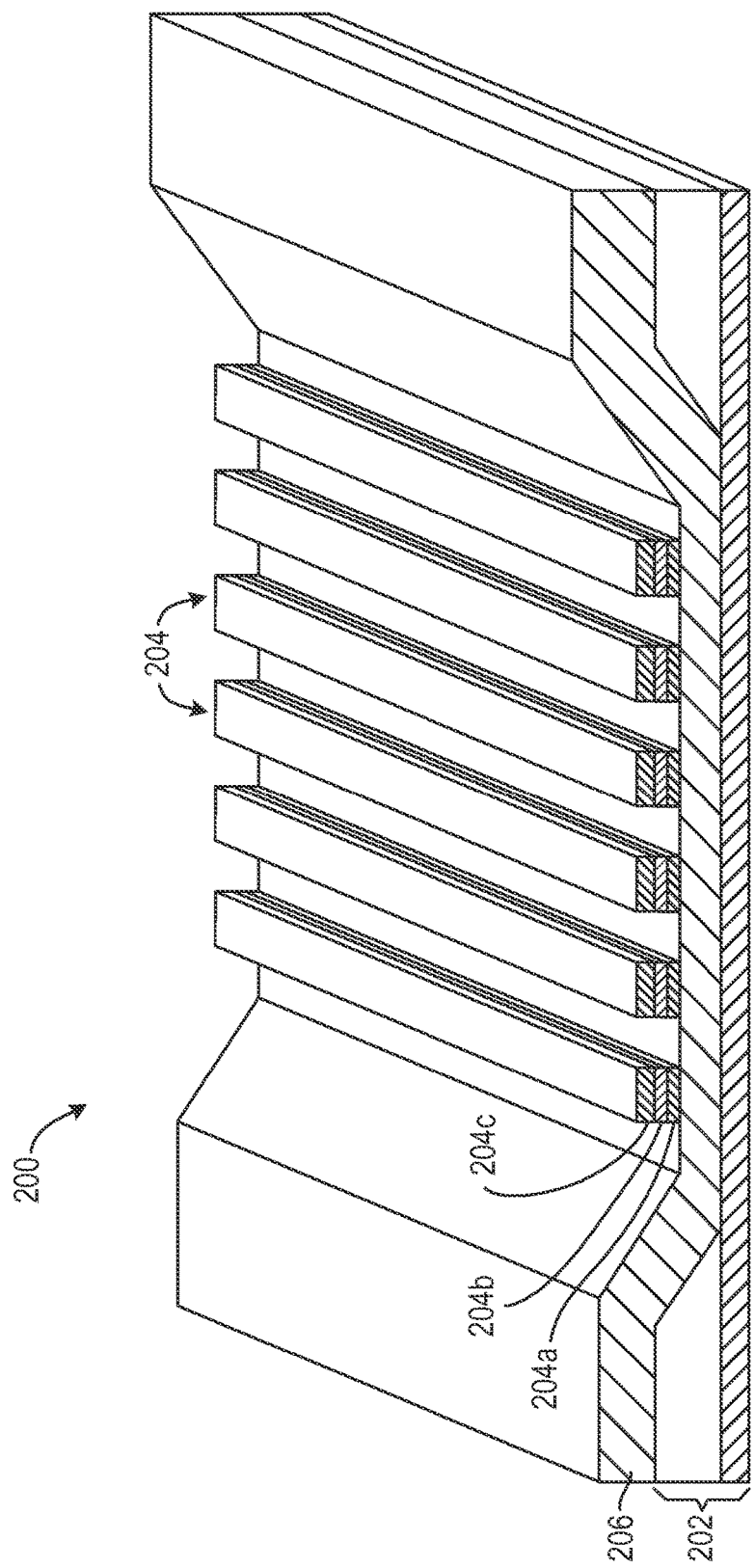
FIG. 2A is an isometric view of the plurality of memristors formed on the thermal inkjet structure of FIG. 2, according to an example.
Figure 2B:
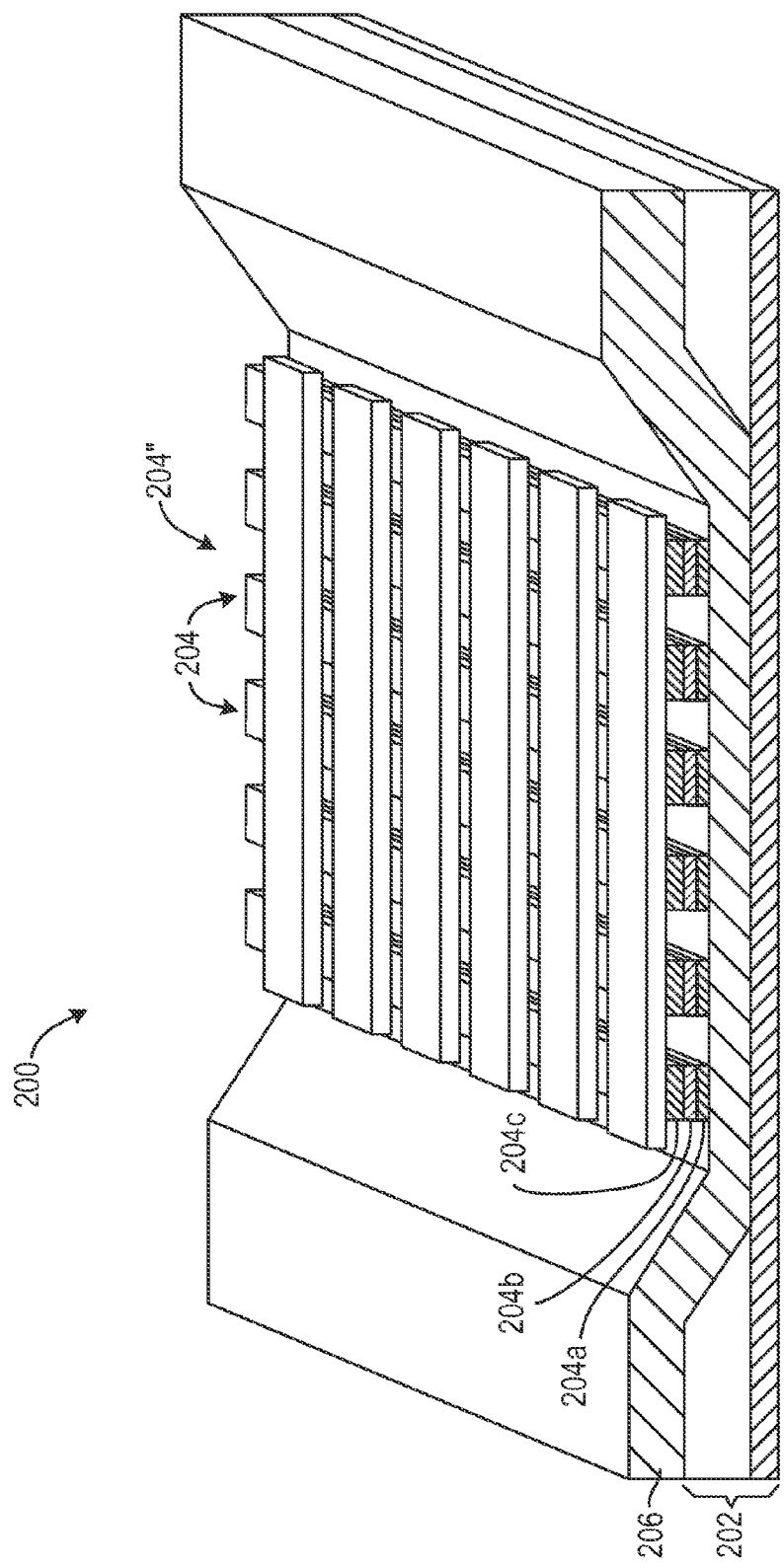
FIG. 2B is an isometric view of a crossbar employing a plurality of memristors formed on the thermal inkjet structure of FIG. 2, according to an example.

FIGS. 2A and 2B depict two examples of non-volatile memory elements, such as memristors. In FIG. 2A, the elements 204 are individual, while in FIG. 2B, a portion of a crossbar 204" is shown, with the bottom electrodes forming "rows" and the top electrodes forming "columns", the rows being disposed at a non-zero angle with respect to the columns. It may be appreciated that there can be multiple TIJ resistors, each hooked up to same voltage/pulse condition or different, depending on the application.

A memristor can be used as non-volatile memory (NVM) and it has the capability of multi-level programming (MLP). Consequently, a method of memristor MLP based on ink-jet printing technology may be employed. It is like introducing a third thermal control gate to 2-terminal memristors. The architecture may be used for phase change memories (PCM) or other resistive RAM (RRAM) devices as well.

The multi-level programming (MLP) technique disclosed herein may reduce the cost-per-bit through multiple states stored in one cell illustrated in FIGS. 3A-3B.

Memristors usually store 1 bit/cell, with a logic "0" and a logic "1", as depicted in FIG. 3A. Although the logic "0" is shown at a lower resistance and the logic "1" is shown at a higher resistance, the definitions may be reversed, with the logic "0" defined at a higher resistance and the logic "1" defined at the lower resistance.

Using MLP, 2 bits/cell may be stored, with logic "00" at the lowest resistance, logic "01" defined at the next higher resistance, logic "10" defined at the even next higher resistance, and logic "11" defined at the highest resistance. Of course, as with the 1 bit/cell, the definitions may be reversed so that logic "11" is at the lowest resistance and logic "00" is at the highest resistance, etc.

The combination of electrical bias and elevated temperatures provided by the built-in TIJ heater can better switch the device to a target resistance value, which is critical for multilevel cell applications. For example, ON state 1 may be done at room temperature, ON state 2 may be done at 150° C., and ON state 3 may be done at 300° C., and so forth.

Figure 4:
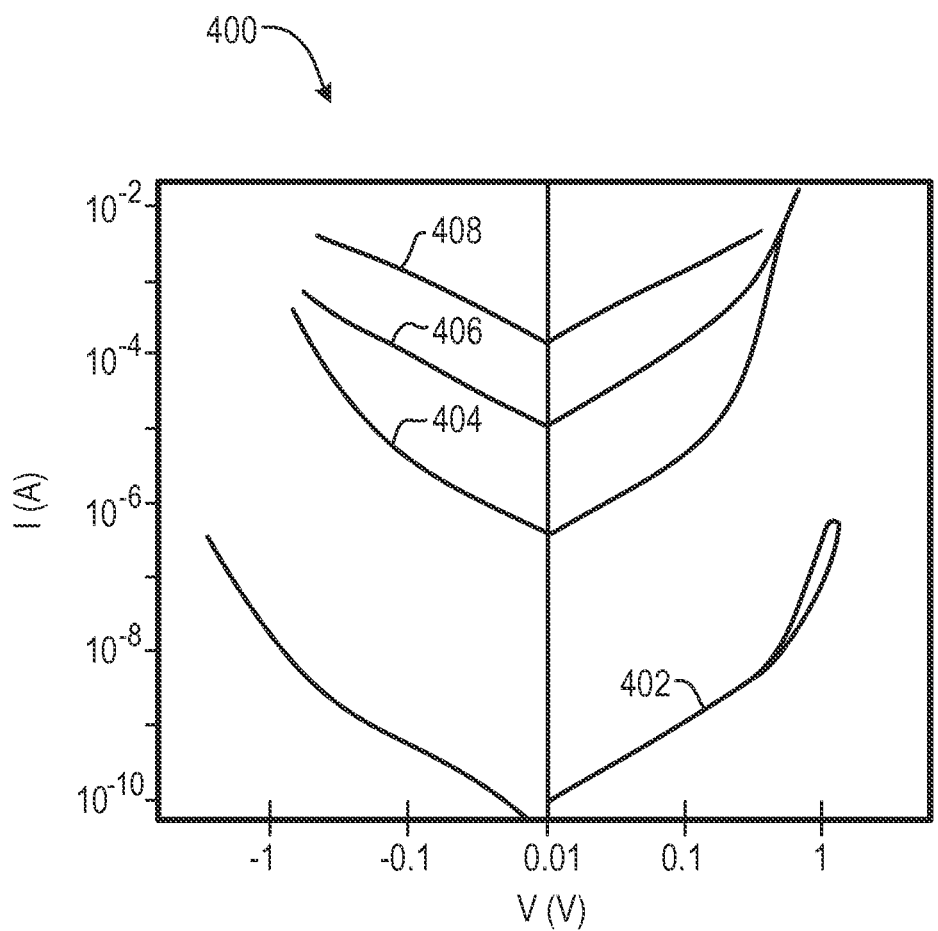
FIG. 4, on coordinates of current (amps) and voltage (volts), depicts a series of I-V curves for a memristor having 2 bits/cell, according to an example.

FIG. 4 is an I-V plot 400, showing the various resistance states achieved at a temperature of 290K and measured at room temperature. Curve 402 represents a virgin state, in which there has not been applied a forming or switching voltage. Curves 404 and 406 represent two intermediate states. Curve 408 represents an ON state.

Figure 5:
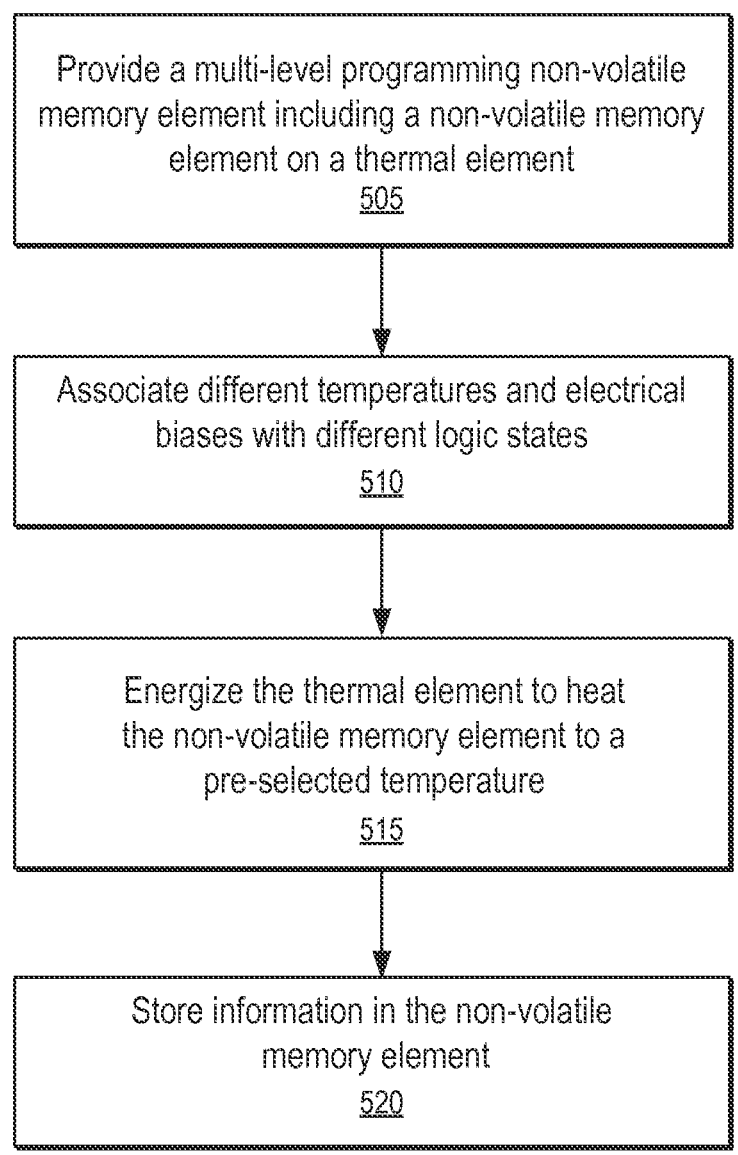
FIG. 5 is a flow chart, depicting a method of operation a multi-level programming non-volatile memory element, according to an example.

FIG. 5 is a flow chart, depicting a method of operating a multi-level programming non-volatile memory element 200, according to an example. The method 500 may include providing 505 multi-level programming non-volatile memory element 200, which includes at least one non-volatile memory element, such as a memristor, 204 on a thermal element 202. The method 500 may include further associating 510 different temperatures and electrical biases with different logic states. The method 500 may further include energizing 515 the thermal element to heat the resistive memory element to a pre-selected temperature. The method 500 may further include storing 520 information in the resistive memory element.

In its most general form, the non-volatile memory element 200 may have multiple states, each associated with a combination of a temperature and electrical bias.

The heating resistor can be easily incorporated into any standard CMOS process by adding a high resistivity layer and a SME/DRE mask. The additional handle for the local thermal management for memristor devices would act like the third terminal for a transistor (back gate). With the introduction of the heating element as a thermal control gate, the following advantages may be achieved:

It may be possible to achieve the MLP for memristors with better control using the thermal compared to simply applying different voltages. Further, the distribution of the resistance states may be tighter and the state-to-state resistance gap may be wider for better state differentiation. This may result in a lower bit error rate and an easier sensing scheme to read out the stored information.

In addition to the possibility of realizing multilevel storage, the local temperature control may allow the memristor to operate in a reliable and optimal condition.

The temperature may be controllable either through voltage or a pulse applied to the resistor, which may lead to design flexibility for the circuit.

What is claimed is:

1. A non-volatile memory element with thermal-assisted switching control, comprising:
   a thermal element having a thickness of 95 nanometers, the thermal element to heat a resistive memory element; and the resistive memory element disposed on the thermal element
wherein the thermal element heats the resistive memory element to different temperature regimes to perform different tasks.

2. The non-volatile memory element of claim 1, wherein the resistive memory element s a memristor.

3. The non-volatile memory element of claim 1, wherein the thermal element is a thermal inkjet resistor, the non-volatile memory element further comprising the thermal inkjet resistor, a passivation layer on the thermal inkjet resistor, and the resistive memory element on the passivation layer.

4. The non-volatile memory element of claim 3, in which the thermal inkjet resistor comprises a relatively low resistivity electrically conducting material disposed on a relatively high resistivity electrically conducting material.

5. The non-volatile memory element of claim 4, in which the thermal inkjet resistor is selected from the group consisting of AlCu on TaAl, AlCu on WSiN, AlCu on TaAlOx, AlCu on TiN, TaAl on TiN/AlCu, WSiN on TiN/AlCu, TaAlOx on TiN/AlCu, and TiN on TiN/AlCu.

6. The non-volatile memory element of claim 3, wherein the passivation layer is selected from the group consisting of silicon nitride, silicon carbide, and silicon dioxide.

7. The non-volatile memory element of claim 3, wherein the resistive memory element is a memristor having a structure that includes a bottom electrode, an active region, and a top electrode.

8. A method of manufacturing a multi-level programming non-volatile memory element; comprising disposing a non-volatile memory element on a thermal element, wherein:
the non-volatile memory element has multiple states, each state associated with a temperature and an electrical bias;
the thermal element heats a resistive memory element of the non-volatile memory element to multiple temperatures to place the resistive memory element in different states; and
the thermal element has a thickness of 95 nanometers.

9. The method of claim 8, comprising:
providing a thermal inkjet resistor as the thermal element;
forming a passivation layer on the thermal inkjet resistor; and
forming the non-volatile on the passivation layer.

10. The method of claim 9, in which the thermal inkjet resistor comprises a relatively low resistivity electrically conducting material disposed on a relatively high resistivity electrically conducting material.

11. The method of claim 10, in which the thermal inkjet resistor is selected from the group consisting of AlCu on TaAl, AlCu on WSiN, AlCu on TaAlOx, AlCu on TiN, TaAl on TiN/AlCu, WSiN on TiN/AlCu, TaAlOx on TiN/AlCu, and TiN on TiN/AlCu.

12. The method of claim 9, wherein the passivation layer is selected from the group consisting of silicon nitride, silicon carbide, and silicon dioxide.

13. The method of claim 9, wherein the non-volatile memory element is a memristor having a structure that includes a bottom electrode, an active region, and a top electrode.

14. A method of operating a multi-level programming non-volatile memory element including a non-volatile memory element on a thermal element, the method including:
providing the multi-level programming non-volatile memory element including the non-volatile memory element on the thermal element, which thermal element has a thickness of 95 nanometers;
associating different temperatures and electrical biases with different logic states;
energizing the thermal element to heat the non-volatile memory element to a pre-selected temperature; and
storing information in the non-volatile memory element.

15. The method of claim 14 in which the non-volatile memory element has multiple states, each associated with a combination of a temperature and electrical bias.

16. The non-volatile memory element of claim 1, wherein the thermal element is a dual-metal layer resistor.

17. The non-volatile memory element of claim 1, wherein:
the thermal element is disposed under a crossbar array of non-volatile memory elements;
top electrodes of resistive elements form columns of the crossbar array; and
bottom electrodes of resistive elements form rows of the crossbar array.

18. The non-volatile memory element of claim 1, wherein:
the thermal element heats the resistive memory element to a first temperature regime to control multi-cell applications:
the thermal element heats the resistive memory element to a second temperature regime to repair a dead non-volatile memory element;
the thermal element heats the resistive memory element to a third temperature regime to reset the non-volatile memory element; and
the thermal element heats the resistive memory element to a fourth temperature regime to electroform the non-volatile memory element.

19. The non-volatile memory element of claim 4, wherein:
the relatively low resistivity electrically conducting material as a sheet resistance between 0.04 and 0.08 ohm/sq; and
the relatively high resistivity electrically conducting material has a sheet resistance between 30 and 120 ohm/sq.

* * * * *

UNITED STATES PATENT AND TRADEMARK OFFICE
CERTIFICATE OF CORRECTION

PATENT NO. : 9,870,822 B2  
APPLICATION NO. : 15/102718  
DATED : January 16, 2018  
INVENTOR(S) : Ning Ge et al.

Page 1 of 1

It is certified that error appears in the above-identified patent and that said Letters Patent is hereby corrected as shown below:

In the Claims

Column 7, Claim 2, Line 7, delete "s" and insert -- is --, therefor.

Column 7, Claim 8, Line 32, delete "element;" and insert -- element, --, therefor.

Column 8, Claim 15, Line 20, delete "claim 14" and insert -- claim 14, --, therefor.

Column 8, Claim 19, Line 50, delete "as" and insert -- has --, therefor.

Signed and Sealed this  
Seventeenth Day of July, 2018

Andrei Iancu  
*Director of the United States Patent and Trademark Office*